(12) United States Patent
Shelnut

(10) Patent No.: US 6,455,231 B1
(45) Date of Patent: Sep. 24, 2002

(54) DRY FILM PHOTOIMAGEABLE COMPOSITIONS

(75) Inventor: James G. Shelnut, Northborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/433,153

(22) Filed: Nov. 3, 1999

(51) Int. Cl.⁷ ............................................. G03F 7/033
(52) U.S. Cl. ...................... 430/306; 430/300; 430/322; 430/309; 430/325; 430/270.1; 430/284.1; 430/277.1; 430/927
(58) Field of Search .................. 430/270.1, 284.1, 430/277.1, 300, 320, 329, 322, 309, 306, 325, 905, 913, 927, 11

(56) References Cited

U.S. PATENT DOCUMENTS

| | | |
|---|---|---|
| RE28,682 E | 1/1976 | Hoey |
| 3,961,961 A | 6/1976 | Rich |
| 4,282,310 A | 8/1981 | Edhlund |
| 4,293,635 A | 10/1981 | Flint et al. |
| 4,343,885 A * | 8/1982 | Reardon, Jr. ................ 430/177 |
| 4,592,816 A * | 6/1986 | Emmons et al. ......... 204/180.6 |
| 4,692,396 A * | 9/1987 | Uchida ....................... 430/284 |
| 5,108,782 A | 4/1992 | Reed |
| 5,120,633 A * | 6/1992 | Bauer et al. ................ 430/176 |
| 5,326,674 A | 7/1994 | Toyama et al. |
| 5,397,678 A | 3/1995 | Sato et al. |
| 5,409,800 A * | 4/1995 | Sato et al. .................. 430/263 |
| 5,424,120 A | 6/1995 | Culbertson |
| 5,494,774 A | 2/1996 | Ali et al. |
| 5,496,678 A * | 3/1996 | Imai et al. .................. 430/176 |
| 5,525,454 A | 6/1996 | Fujikura et al. |
| 5,985,998 A * | 11/1999 | Sommerfeld et al. ......... 525/72 |
| 6,004,725 A * | 12/1999 | Barr et al. ................ 430/284.1 |
| 6,037,100 A * | 3/2000 | Yu et al. .................. 460/273.1 |
| 6,057,079 A * | 5/2000 | Shelnut .................... 430/272.1 |

FOREIGN PATENT DOCUMENTS

| | | |
|---|---|---|
| EP | 0 640 878 A1 | 3/1995 |
| EP | 0 927 911 A | 7/1999 |
| EP | 0 935 171 A | 8/1999 |
| EP | 0 969 324 A | 1/2000 |

OTHER PUBLICATIONS

Database WPI, Section Ch, Week 199542, Derwent Publications Ltd., London, GB; Class A89, AN 1995–323799, XP002158951 & JP 07 219218 A (Konica Corp.), Aug. 18, 1995 (Abstract).

Database WPI, Section Ch., Week 198623, Derwent Publications ltd., London, GB; Class A89, AN 1986–146529, XP002158952 & JP 61 080236 A (Toshiba KK), Apr. 23, 1986 (Abstract).

* cited by examiner

Primary Examiner—Janet Baxter
Assistant Examiner—Yvette M. Clarke
(74) Attorney, Agent, or Firm—John J. Piskorski; Peter F. Corless

(57) ABSTRACT

Dry film resists of the invention in general comprise a photoactive component, a highly viscous or solid (at room temperature, ca. 25° C.) crosslinker component, and preferably a flexibilizing agent. Preferred dry film constructions of the invention do not require the use of a protective cover sheet due to the composition's very dry nature.

32 Claims, No Drawings

DRY FILM PHOTOIMAGEABLE COMPOSITIONS

BACKGROUND OF THE INVENTION

1. Field of the Invention

The present invention relates to new photoresist dry film constructions and compositions. Preferred dry film of the invention are characterized as including a base carrier sheet, but without any type of cover sheet. These preferred dry film resists can be photoimaged in the absence of the carrier sheet, enabling significant cost and waste reductions as well as significant improvements in resolution of the patterned resist.

2. Background

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist may be developed in a suitable developer to provide a relief image that permits selective processing of a substrate.

Photoresists are often formulated and applied as liquid compositions and the liquid carrier is removed after coating onto a substrate surface.

For many applications however including printed circuit board manufacture, dry film resists are frequently employed. See, for instance, U.S. Pat. Nos. 5,300,913, 4,943,513 and 4,610,951 for background on dry film resists. Such resists are applied as a solid (dry film) coating layer to a copper laminate or other substrate. A typical dry film contains a base or carrier sheet over which is coated a photoimageable composition with subsequent removal of the composition liquid carrier. Polyethylene terephthalate (PET) is a common carrier sheet.

To protect the unprotected surface of the photoimageable coating and to facilitate rolling of the carrier sheet/photoimageable construction, the unprotected composition surface is covered with a removable protective sheet such as a polyethylene (PE) layer, polypropylene layer or a polyethylene terephthalate (PET) layer.

Despite the nomenclature, a typical dry film photoresist is a highly viscous liquid that contains a certain amount of tack after drying. As a result, when a carrier sheet (e.g. PET) is coated and the photoresist is applied and dried, a protective cover sheet such as polyethylene is required. Without that cover sheet, the photoresist would adhere to the backside of the PET when it is wound around a plastic core into a roll, which is a typical dry film construction form.

In use, the cover sheet (typically PE) is removed from the dry film construction and the exposed side is applied to a copper laminate or other substrate surface. The PET carrier sheet remains, overlaying the photoresist through exposure. A sheet that contains the desired pattern (photomask) is placed on top of the PET carrier sheet and through which activating radiation is applied and the pattern is transferred to the resist. The carrier sheet is required through exposure. If the carrier sheet were removed prior to exposure, the photomask sheet would adhere to the surface of the tacky photoresist.

Hence, the PET or other carrier sheet must have high optical quality to avoid undesired interference with the radiation passed therethrough to the resist layer. Interference with the exposure radiation can compromise resolution of the image patterned into the resist layer and transferred to the underlying copper or other substrate surface. After the exposure step, the carrier sheet is removed and discarded in order to permit development of the latent image patterned in the resist layer.

Moreover, as a viscous liquid sandwiched between the carrier and protective sheets, the dry film is subject to flow over time. Such "cold" flow can result in thin spots, thin lines, or other areas where film thickness is less than desired, all of which can significantly compromise lithographic performance and reduce production yields. In particular, any surface protrusions in the carrier and protective sheets will cause thin spots and voids. Such protrusions are generally present in the PE cover sheet. Additionally, flow can occur at the end of a dry film roll where resist flows out and fuses with other areas of flow. Such end flow requires slitting of the end prior to use of the dry film, resulting in significant waste and again potentially compromising lithographic results. Additionally, when the dry film is unwound, the "fused" resist will flake and can be caught between the photoresist and substrate resulting in processing variations and subsequent yield losses.

It thus would be desirable to have new dry film constructions.

SUMMARY OF THE INVENTION

I have now found new photoresist compositions and dry film constructions that are highly useful in negative-tone dry film resist constructions.

Preferred dry film resist constructions of the invention do not require the use of a protective cover sheet due to the resist's very dry nature. In particular, because of such high dryness of the composition, a carrier sheet (e.g. PET) is not required during the exposure step since the pattern containing sheet (photomask) will not adhere to the resist composition during exposure. Moreover, enhanced resolution of the image patterned in the resist can result since the carrier sheet (e.g. PET) will not be present to potentially interfere (e.g. diffraction or other optical interference) with the exposure radiation.

Dry film resists of the invention preferably comprise at least a photoactive component, and a highly viscous or solid (at room temperature, ca. 25° C.) crosslinker component. A flexibilizing agent also may be added, e.g. depending on other resist composition choices. Additionally, a film forming polymer can be added to aid in coating and processing of the resist.

The crosslinker component of prior dry film resists conventionally has been comprised in at least significant part of one or more monomers (e.g. unsaturated compounds) or other relatively low molecular weight compounds. It has been found that such low molecular crosslinkers are a predominant cause of undesired cold flow during storage of a dry film resist roll.

I have found that use of oligomeric or other higher molecular weight crosslinkers can provide a dry film resist that is essentially dry and tack free. In fact, unlike prior dry film compositions, resist compositions of the invention have melt point or sharp $T_g$, e.g. about 35° C. or 40° C. or greater, more preferably about 45° C. or 50° C. or greater. Exemplary preferred crosslinkers include acrylated urethanes, preferably having a weight average molecular weight of at least about 500 daltons, more typically an Mw of from about 500 to 100,000, still more typically from about 1,000 to 50,000. Another preferred crosslinker is an acrylate oligomer, typically having a weight average molecular weight of from about 100 to 5,000 daltons. In general, preferred crosslinkers of the compositions of the invention will have a molecular weight of at least about 400 daltons, more preferably at least about 500, 600, 700, 800, 900 or 1000 daltons. Generally preferred crosslinkers are polymeric compounds. Generally preferred compositions of the invention contain a crosslinker component that is predominately (greater than 50 weight %) comprised of compounds having a molecular weight (Mw) of about 15,000 daltons or greater, more preferably a molecular weight (Mw) of about 75,000 or greater. Even more preferably, the crosslinker is comprised of at least about 30, 50, 60, 70, 80, 90, or even 95 weight percent of such high molecular weight crosslinker compounds. The crosslinker component may contain a relatively minor portion of low molecular weight monomer-type compounds, although such use of such compounds is less preferred.

In preferred compositions, a film forming polymeric material may be added that has a Tg sufficiently high to allow use of low molecular weight materials while maintaining an overall compositional Tg above room temperature.

I have also found that the further use of a flexibilizing agent can be preferred. Among other things, use of flexibilizing agent allows composition choices to be broadened and allows the use of materials that can enhance a resist's overall profile but that may embrittle the resist. More particularly, the use of a flexibilizing agent enables the resist composition to exhibit sufficient flexibility to enable forming a roll of the resist, without cracking or other degradation. A variety of compositions may be suitably employed as the flexibilizing agent. Preferred materials are straight chain oligomers or polymers, preferably containing hetero atoms (particularly O or S) to facilitate intermixing of the flexibilizing agent with other composition components. For example, a preferred flexibilizing agent is POLYMEG 650 (from Quaker Chemical). Additional suitable flexibilizing agents include an aliphatic urethane such as those commercially available from Sartomer. The flexibilizing material in this case can act as a reactive monomer.

Resist compositions of the invention further include a photoactive component, typically a free radical initiator. The resists of the invention also may include other additives such as adhesion promoters, dyes, leveling agents and the like as may be generally known.

Dry film resists of the invention preferably will be not only be dry and tack-free (e.g. by the tissue paper test as discussed below), but also exhibit a sharp $T_g$ indicating a melting point of the composition. Such a sharp $T_g$ enables lamination of the dry film resist to a substrate (e.g. via hot roll laminator under conditions to enable melting of the resist) with the resist adhering to the substrate and exhibiting sufficient fluid characteristics to fill imperfections in the substrate surface.

The invention also includes the construction or rolls of dry film resists of the invention, and articles of manufacture such as a printed circuit board substrate or other electronic packaging substrate coated with a dry film resist of the invention. Dry film rolls of the invention preferably do not include a protective cover sheet, and comprise a resist of the invention coated on a base carrier sheet, including with the resist layer rolled directly onto itself (i.e. without any type of interposed cover sheet). That is, the rolled construction includes the coated sheet rolled directly up onto itself, with the unprotected surface of the resist in direct contact with the reverse side of the carrier sheet.

The invention also includes methods for forming a relief image of a dry film resist of the invention, which method does not require removal of a protective carrier sheet of the dry film construction. Artwork (photomask) can be placed directly on the dry film carrier sheet or resist top surface during imaging.

Methods of the invention also can not include a step of removal of a carrier sheet from the dry film resist (particularly where such a sheet is not employed). Additional preferred methods include that may employ a dry film construction that does has a protective cover sheet, but the cover sheet is removed prior to imaging and artwork (photomask) is placed directly on the dry film top surface.

Other aspects of the invention are discussed infra.

DETAILED DESCRIPTION OF THE INVENTION

As discussed above, dry film photoresists of the invention are substantially "drier" than prior dry film resist compositions, enabling fabrication of the dry film construction without the use of a protective cover sheet, thereby providing significant cost and waste savings and images of enhanced resolution.

Preferred levels of "dryness" of dry films of the invention can be assessed in a number of ways. A preferred method is a "tissue paper test" which includes pressing a tissue paper into a photoresist layer by hand manipulation and then manually removing the tissue paper. Dryness or tackiness of the resist layer is measured by ease of removal for the tissue paper. Specifically, a tacky dry film will result in tear or other such degradation of the tissue paper upon attempts to remove the impressed paper. A preferred "dry" resist of the invention will enable removal of the tissue paper without leaving an imprint (naked eye inspection) on the resist surface.

The use of the highly viscous or solid (room temperature) crosslinker component together with a flexibilizing agent provides a dry film construction that is substantially resistant to cold flow, yet reasonably flexible to enable forming a dry film roll without breakage or other degradation of the rolled resist.

Resists of the invention may be suitably a primary imaging resist e.g. for forming a printed circuit board, or alternatively may be a permanent photoimageable coating e.g. to function as a solder mask, permanent inner layer, advanced dielectric, chip scale packaging, or the like in an electronic packaging substrate such as a printed circuit board.

As discussed above, resists of the invention further contain a photoactive component, which preferably comprises one or more free radical initiators such as IRAGACURE 184 from Ciba Geigy, isopropyl thioxanthone and the like.

The resist also may contain any number of additional ingredients including dyes, photosensitizers, leveling agents, adhesion promoters and the like. More particularly, various triazoles may be employed as adhesion promoters, such as benzatriazole and substituted benzatriazoles e.g. carboxy benzatriazole. Suitable dyes include solvent blue 57 and leuco crystal violet. Suitable leveling agents include Modaflow from Monsanto. Suitable antioxidants include triphenylphosphite and triphenylphosphine.

Dry film constructions of the invention are prepared by generally known methods. For example, all the resist components can be admixed in a solvent carrier and then coated onto a base or carrier sheet such as PET or other suitable material. The solvent carrier is then removed, e.g. by heating the coated sheet at from 80 to 120° C. for about 3 to 30 minutes.

The dried resist layer then can be formed into a dry film roll, without any protective cover sheet being placed on the resist top surface. The dried film does not crack upon creasing or other manipulation that occurs in the roll formation. Prior dry film constructions are of such a tacky quality that they adhere to the backside of the carrier sheet when constructed into a roll and without use of a protective cover sheet. In contrast, photoresist compositions of the invention when wound into a roll will not transfer to the backside of a carrier sheet.

The dry film resist roll then can be directly applied e.g. by lamination to a substrate surface without the necessity of removal and disposal of a cover sheet as employed with prior dry film resist systems. The cover sheet is commonly considered hazardous waste due to the ability of the sheet to absorb reactive monomer. Dry film constructions of the invention may be suitably applied onto a wide variety of substrates, and preferably will be applied to a copper surface of a printed circuit board substrate. The resist is preferably laminated onto such a substrate followed by removal of the carrier sheet.

A dry film resist of the invention is preferably applied to a copper clad laminate (printed circuit board substrate) or other substrate via a hot roll laminator. Suitable hot roll laminator conditions include from about 150 to 300° F., more preferably from about 200 to 280° F., still more preferably from about 220 to 250° F. The hot roll laminator pressure may be from about 20 to 50 psi, preferably about 25 to 35 psi. The speed of the laminator may be from 1 to 10 feet per minute (fpm), more preferably 2 to 8 fpm, still more preferably 3–6 fpm. The substrates may be pre-heated prior to entering the laminator.

After such application of the resist to the substrate, a photomask is placed on the resist in an exposure tool, and the resist is exposed to patterned activating radiation.

Typical prior dry film resists require the carrier sheet to remain on the photoresist during exposure as the artwork that carries the image that is to be transferred. As discussed above, the carrier sheet prevents the artwork from adhering to a tacky resist layer. However, the carrier sheet can interfere with the collimation of the activating radiation, particularly by surfaces of the carrier sheet reflecting and diffracting incident light. Consequently, current dry film resist systems often employ carrier sheets that are highly optically clear, which adds significantly to the expense of the sheet material and the dry film construction.

Film thickness is another limitation often encountered during dry film resist manufacture. Because typical dry film resists are highly viscous liquids, any imperfections in the cover sheet such as gel slugs can cause the resist to flow away from the point of stress, which can result in thin spots and voids. Such problems have been addressed by manufacturing the dry film resist to a thickness sufficient to consistently transfer the image to an underlying substrate, e.g. a dry film resist thickness of a minimum of about 1.3 mils up to a thickness of about 2 mils or more.

However, dry film resists of the invention can be manufactured at significantly decreased thicknesses. Because resists of the invention do not require protective cover sheets, resists of the invention do not require a thickness necessary to compensate for imperfections in the cover sheet. More particularly, dry film resists of the invention suitably may have a thickness of about 1.0 mil or less, preferably from about 0.1 to 1 mils, more preferably from about 0.2 to 0.8 mils, still more preferably from about 0.3 to about 0.5 or 0.8 mils.

The exposure is sufficient to effectively activate the photoactive component of the photoresist system to produce a patterned image in the resist coating layer and, more specifically, the exposure energy typically ranges from about 1 to 10 to 250 mJ/cm$^2$, dependent upon the exposure tool and the components of the photoresist composition.

Following exposure, the film is developed to remove unexposed regions of the resist layer. An alkaline developer may be used if the resist contains a resin or other component with acid groups as discussed above. A preferred developer is a sodium carbonate aqueous solution, particularly a 1 wt % or 2 wt % carbonate aqueous solution. An acidic developer solution alternatively may be employed if the resist contains a resin or other component with basic groups to enable such development.

Following development of the photoresist coating over the substrate, the developed substrate may be selectively processed on those areas bared of resist, for example by chemically etching or plating substrate areas bared of resist in accordance with procedures known in the art. After such processing, resist may be removed from the processed substrate using known stripping procedures.

As discussed above, dry film resists of the invention preferably will be not only dry and tack-free (e.g. by the tissue paper test as discussed above), but also exhibit a sharp $T_g$ indicating a melting point of the composition. Such a sharp $T_g$ enables lamination of the dry flm resist to a substrate (e.g. via hot roll laminator under conditions to enable melting of the resist) with the resist adhering to the substrate and exhibiting sufficient fluid characteristics to fill imperfections in the substrate surface. More particularly, preferred compositions of the invention will exhibit a Tg above about 45° C. or 50° C., more preferably of at least about 60° C., 70° C. or 80° C., still more preferably at least about 90° C., 100° C., 110° C. or 120° C.

The following non-limiting examples are illustrative of the invention. All documents mentioned herein are incorporated herein by reference.

Example 1

A preferred dry film photoresist of the invention was prepared by admixing the following materials, with amounts expressed as parts by weight, based on total weight of the resist.

| Component | Amount |
|---|---|
| 1. Monomers | |
| Urethane triacrylate monomer | 2.90% |
| Ethoxylated trimethylol triacrylate | 2.90% |
| Pentaerythritol tetaaacrylate | 3.86% |
| 2. Resin | |
| SCRIPTSET 540 | 20.46% |
| 3. Free radical initiators | |
| IRGACURE 907 | 1.62% |
| Isopropyl thioxanthone | 0.811% |
| 3. Flexible additive | |
| POLYMEG 650 | 3.76% |
| 4. Adhesion promoters | |
| Carboxy benzatriazole | 0.048% |
| Benzatriazole | 0.048% |
| 5. Other additives | |
| Triphenylphosphite | 0.154% |
| Triphenylphosphine | 0.154% |
| MODAFLOW | 0.251% |
| SOLVENT BLUE 67 | 0.058% |
| Leuco crystal violet | 0.251% |
| 6. Solvent | |
| Propylene glycol methyl acetate | 62.73% |

The above resist composition is coated using a slot coater onto a carrier sheet made from polyethylene terephthalate to a thickness of 0.5 mils. The applied resist coating is dried for 15 minutes at 90° C. The applied dry film then can be rolled into a final product roll. At this point the film can be creased without cracking. On a hot roll laminator set at 235° F., the dry film is laminated onto mechanically scrubbed copper at a speed of 3 feet per minute. The carrier sheet is removed and the dry film composite is placed into a vacuum-frame exposure unit, covered with the desired artwork and exposed at 200 mJ. Development in 1% carbonate at 95° F. with a 2× breakpoint gives an image with a Stouffer step 6–7 to provide resolution of 1 mil lines and spaces.

Comparative Example 1

The same photoresist composition was employed and the same processing procedures were carried out as described in Example 1 above, except after lamination of the dry film resist to the mechanically scrubber copper, the carrier sheet carrier sheet was left on the resist coating interposed between the resist and exposure unit, and the resist was exposed and then developed to give a Stouffer step of 7–8 using 250 mJ but a resolution of 4 mils lines and spaces.

Example 2

A composition is prepared with the same components of Example 1 above, except no ethoxylated TMPTA is present and the Scripset resin is replaced with a polymer prepared from the combination of styrene and maleic anhydride which is esterified with hydroxyethylmethacrylate. Since that polymer crosslinks into the resist during exposure the amount of low viscosity monomer can be reduced. Processing of the resist composition is performed as described in Example 1 above.

The foregoing description of the invention is merely illustrative thereof, and it is understood that variations and modification can be made without departing from the spirit or scope of the invention as set forth in the following claims.

What is claimed is:

1. A method for forming a photoresist relief image on a printed circuit board substrate comprising:
    laminating a dry film photoresist layer to a copper printed circuit board substrate surface, the dry film photoresist comprising a resin having a $T_g$ of at least about 110° C., a photoactive component and a viscous or solid crosslinker component, the crosslinker component is comprised of at least 50% by weight of an acrylated urethane monomer having a molecular weight of about 15000 daltons or greater, and the dry film photoresist has a $T_g$ of at least 110° C. and is tack free;
    applying a photomask directly on the dry film photoresist layer top surface; and exposing the dry film photoresist layer to activating radiation, and developing the exposed layer to provide a photoresist relief image.

2. The method of claim 1, wherein the dry film photoresist further comprises a flexibilizing agent.

3. The method of claim 1 wherein the dry film photoresist composition does not contain a protective cover before lamination.

4. The method of claim 1, wherein the acrylated urethane monomer comprises from 50% to 95% by weight of the crosslinking agent component.

5. The method of claim 1, wherein the resin has a $T_g$ of at least about 130° C.

6. The method of claim 1, wherein the $T_g$ of the dry film photoresist is at least about 120° C.

7. The method of claim 1, wherein the dry film photoresist layer has a thickness of about 1.0 mil or less.

8. The method of claim 7, wherein the dry film photoresist layer has a thickness of about 0.1 mil to about 1 mil.

9. The method of claim 8, wherein the dry film photoresist layer has a thickness of from about 0.2 mils to about 0.8 mils.

10. A method for forming a photoresist relief image on a substrate comprising:
    applying a dry film photoresist to a substrate, the dry film photoresist comprising a resin having $T_g$ of at least about 110° C., a photoactive component and a viscous or solid crosslinker component, the crosslinker component contains at least 50% by weight of an acrylated urethane monomer having a molecular weight of about 15000 daltons or greater, and the photoresist has a $T_g$ of at least 110° C. and is tack free, the dry film photoresist does not contain a protective cover sheet;
    exposing the dry film photoresist layer to patterned activating radiation, and developing the exposed layer to provide a photoresist relief image.

11. The methodof claim 8 wherein a carrier sheet is removed prior to exposing the dry film photoresist layer to patterned activating radiation.

12. The method of claim 10 wherein the dry film photoresist further comprises a flexibilizing agent.

13. The method of claim 10 wherein the substrate is a copper clad printed circuit board substrate.

14. The method of claim 10, wherein the acrylated urethane monomer comprises from 50% to 95% by weight of the crosslinking agent component.

15. The method of claim 10, wherein the resin has a $T_g$ of at least about 130° C.

16. The method of claim 10, wherein the $T_g$ of the dry film photoresist is at least about 120° C.

17. The method of claim 10, wherein the dry film photoresist layer has a thickness of about 1.0 mil or less.

18. The method of claim 17, wherein the dry film photoresist layer has a thickness of about 1.0 mil to about 1 mil.

19. The method of claim 18, wherein the dry film photoresist layer has a thickness of from about 0.2 mils to about 0.8 mils.

20. A dry film photoresist comprising a resin having a $T_g$ of at least about 110° C., a crosslinking agent component containing an acrylated urethane monomer having a molecular weight of about 15000 daltons or greater, the acrylated urethane monomer comprises at least 50% by weight of the crosslinking agent component, the dry film photoresist has a $T_g$ of at least 110° C. and is tack free.

21. The dry film photoresist of claim 20, wherein the acrylated urethane monomer comprises from 50% to 95% by weight of the crosslinking agent component.

22. The dry film photoresist of claim 20, wherein the acrylated urethane monomer has a molecular weight of 75,000 daltons or greater.

23. The dry film photoresist of claim 20, further comprising a photoactive component, or a flexibilizing agent or mixtures thereof.

24. The dry film photoresist of claim 20, wherein the dry film photoresist is coated on an underlying carrier sheet, the photoresist not containing a top protective sheet.

25. The dry film photoresist of claim 20, wherein the photoresist with the underlying carrier sheet is rolled directly onto itself.

26. The dry film photoresist of claim 18, wherein the resin has a $T_g$ of at least about 130° C.

27. The dry film photoresist of claim 20, wherein the $T_g$ of the dry film photoresist is at least about 120° C.

28. The dry film photoresist of claim 20, wherein the dry film photoresist has a thickness of about 1.0 mil or less.

29. The dry film photoresist of claim 20, wherein the resin has a $T_g$ of at least about 120° C.

30. The dry film photoresist of claim 29, wherein the resin has a $T_g$ of at least about 130° C.

31. The dry film photoresist of claim 20, wherein the dry film photoresist has a $T_g$ of at least about 120° C.

32. A dry film photoresist composition of claim 20 wherein the dry film photoresist comprises comprising a photoactive component, a viscous or solid crosslinker component, and a flexibilizing agent.

* * * * *